United States Patent
Marchman et al.

(10) Patent No.: US 6,787,783 B2
(45) Date of Patent: Sep. 7, 2004

(54) APPARATUS AND TECHNIQUES FOR SCANNING ELECTRON BEAM BASED CHIP REPAIR

(75) Inventors: Herschel M. Marchman, Poughquag, NY (US); Aaron D. Shore, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/321,942

(22) Filed: Dec. 17, 2002

(65) Prior Publication Data

US 2004/0113097 A1 Jun. 17, 2004

(51) Int. Cl.$^7$ .................................................. A61N 5/00
(52) U.S. Cl. ............................................... 250/492.2
(58) Field of Search ............................... 250/492.2, 307

(56) References Cited

U.S. PATENT DOCUMENTS 5,821,549 A * 10/1998 Talbot et al. .............. 250/307
6,211,527 B1 * 4/2001 Chandler ................ 250/492.2

* cited by examiner

Primary Examiner—John R. Lee
Assistant Examiner—Johnnie L. Smith, II
(74) Attorney, Agent, or Firm—Delio & Peterson, LLC; Kelly M. Reynolds; Tiffany L. Townsend

(57) ABSTRACT

A method and apparatus for editing an integrated circuit by bombarding a feature in need of editing with either a low-energy or high-energy electron beam in the presence of a gas whereby low energy electrons activate reactants adsorbed on the surface of the feature in need of editing to form active species on the feature surface. The reaction products from the process can be easily removed whereby IC damage, leakage between metal features, wafer contamination and physical sputtering of undesired material can be significantly minimized while still possessing nanometer-scale spatial resolution. The low energy electrons for activating the reactants adsorbed on the surface of the feature to be edited may be emitted from the electron beam itself or they may be secondary low energy is electrons emitted from the surface of the feature being edited.

20 Claims, 13 Drawing Sheets

First FIB/SEM Process Sequence

Second FIB/SEM Process Sequence

APPARATUS AND TECHNIQUES FOR SCANNING ELECTRON BEAM BASED CHIP REPAIR

BACKGROUND OF THE INVENTION

1. Field of the Invention

The present invention relates generally to semiconductor chip repair and editing, and in particular, to apparatus and processes for editing and repairing integrated circuits having copper and/or organic-based features.

2. Description of Related Art

Present processes for integrated circuit (IC) repair and editing primarily rely on the use of focused ion beams for spatially localized removal and deposition of materials. These beams are generated by a Focused Ion Beam (FIB) tool which utilizes a liquid metal ion source, typically gallium (Ga+), from which highly energetic beams (E>30 keV) are formed and then focused onto the sample surface by electrostatic lenses. However, exposure to these highly energetic ion beams often causes IC damage, gallium contamination, and physical sputtering of the sample surface whereby the actual amount of material removed by such sputtering depends on the total ion dose and energy at each pixel location. Further, a significant amount of the sputtered material is undesirably re-deposited onto adjacent areas. This re-deposition slows the rate at which material can be removed, limits the maximum achievable aspect ratio of holes and openings created by FIB, and can adversely affect the electrical properties of the IC under edit.

Gas-assisted etching techniques, which involve ion beam induced chemical reactions, have been introduced in the art to overcome the problems associated with FIB tools by improving volatilization of these byproducts and thus avoid the undesired re-deposition onto adjacent areas of the sample surface. However, it has been found that gas-assisted etching cannot completely address these issues, due to the continued dependence of FIB on gallium ion based beams for inducing these reactions.

In recent years, the introduction of copper for interconnect metallization has presented additional problems in the processes of chip repair and editing using existing FIB tools and techniques, including those having g assisted etching (GAE) options. In the case of copper interconnect metalization editing, ion beam compatible gas chemistries have not been determined for complete volatilization of the etch products, which leads to re-deposition of conductive copper by-products onto adjacent areas and degradation of the IC's electrical performance. For example, non-volatility and subsequent re-deposition of undesired sputtered metal products on the sidewalls of a deep access hole opening created with FIB during high-aspect ratio repairs involving features down at the lower interconnect levels is shown in the prior art illustration of FIG. 1.

As shown in FIG. 1, an energetic focused ion beam 1 creates a deep-hole 3 opening traversing through a plurality of interconnect levels 4 consisting of metal interconnects and electrically insulative inter-level dielectric (ILD) materials 10 in order to expose a particular metal interconnect feature of interest 5 at the bottom of the deep-hole. The energetic focused ion beam 1 is then focused into the deep-hole 3 so as to contact the metal feature 5 at the bottom of the opening in order to edit the desired interconnect feature without affecting adjacent inter-level dielectric (ILD) materials 10. The IC interconnect is then cut by milling the metal feature (e.g. copper) with little chemical assistance, as there is currently no completely effective ion beam compatible chemistries for volatilization of the metal etch by-products, particularly in the case of copper. As such, these conductive by-products 7 from the FIB milling of the metal are then re-deposited on the surrounding sidewalls of the deep-hole possibly shorting all interconnect layers together. Additionally, the FIB milling process also damages ILD surface areas 9 of interconnect levels 4 on the top surface and along sidewalls within the deep-hole. Another common repair scenario involves clearing large surface areas of metal such as copper that normally have non-uniform removal rates, due to grain orientation dependencies of the ion-beam to sample surface interaction. Also commonly required is the removal of insulator (SiLK or Oxide) materials prior to accessing buried features. In IC editing, the challenge is to smoothly remove the upper layers, or in the case of ILD etching without inducing electrical leakage paths.

In semiconductor IC repair and editing, the limitations of FIB tools have become even more pronounced recently with the introduction of organic-based materials to form the interconnect level ILD layers 4 such as "Silicon Low-K," otherwise known as SiLK™, a registered trademark of Dow Chemical Company. Electronic device damage, gallium contamination, and physical sputtering of the sample surface caused by exposure to the highly energetic ion beams of FIB are dramatically increased in those ICs having organic-based ILD materials as the electronic properties of such materials are dramatically altered by exposure to these highly energetic ion beams. The surface damage and subsequent electrical leakage of these normally very insulative organic ILD layers can result from merely imaging such layers with the FIB, as well as the ensuing milling process which typically brings orders of magnitude higher doses of energetic ions. Most IC damage manifests in the formation of graphitic surface layers which cause electrical conduction and leakage between metal features (either inter- or intra-level). Gas-assisted-etching (GAE) FIB techniques, which utilize ion beam induced chemistries, have been introduced to improve volatilization and removal of damaged ILD material. However, since both mechanical and chemical components are present in GAE FIB methods, there is still ion beam energetic damage to the ILD material.

Additionally, beam-induced deposition of metals for the intended electrical connection of IC features, without re-deposition or damage effects, remains important in chip repair. Beam-induced oxide deposition also remains important for the ability to passivate and subsequently isolate features electrically. Unfortunately, ion beam induced deposition of metals usually damages the underlying ILD layer, which defeats localization of the conductive feature that is desired, while beam-induced deposition of oxide layers (insulator layers) are typically rich in gallium ions, and as a result, exhibit poor electrical isolation in addition to possible induction of conductive organic ILD surfaces lying underneath the deposited oxide coating or mask.

Accordingly, as modern semiconductor technology continues to require smaller ICs having diminished feature sizes, conventional apparatus and techniques for repairing and editing ICs will no longer be reliable. In fact, smaller interconnect features are more easily cut, since there is less initial volume of material to remove. However, it is the increased packing IC densities which severely decrease the separation between features that must be isolated electrically. Accordingly, a need continues to exist in the art for providing improved apparatus and techniques that will be capable of repairing and editing future generations of ICs having reduced feature sizes and increased packing densities without the above disadvantages caused by lack of product volatility in metal etch reactions or energetic ion beam damage of ILD layers.

SUMMARY OF THE INVENTION

Bearing in mind the problems and deficiencies of the prior art, it is therefore an object of the present invention to provide apparatus and techniques for integrated circuit chip repair that significantly minimize IC damage, electronic device damage, leakage between metal features, damage to ILD material, wafer contamination (gallium contamination) and physical sputtering of undesired material while still possessing nanometer-scale spatial resolution.

The above and other objects and advantages, which will be apparent to one of skill in the art, are achieved in the present invention, which, is directed to in a first aspect a method of editing an integrated circuit by providing an integrated circuit, locating at least one feature in need of editing on the integrated circuit and contacting the feature in need of editing with an electron beam. In so doing, the low energy electrons activate reactants adsorbed on the surface of the feature in need of editing to form byproducts that are then removed thereby editing the feature. The electron beam may be either a low-energy electron beam or a high-energy electron beam. The low energy electrons for activating the reactants adsorbed on the surface of the feature to be edited may be emitted from the electron beam itself or they may be secondary low energy electrons emitted from the surface of the feature being edited.

In a first embodiment of the invention, wherein the feature in need of editing is a metallic interconnect feature, the process further includes forming a mask over the metallic interconnect feature and bombarding those portions of the metallic interconnect feature exposed through the mask with electrons emitted from the electron beam. An etch gas is then emitted over the bombarded metallic interconnect feature whereby low energy electrons activate reactants adsorbed on the surface of the feature to form a metal byproduct layer which is subsequently removed thereby editing the integrated circuit. The etch gas may be a halogen etch gas that forms a metal halide layer that is subsequently removed, or alternatively, the etch gas may be an oxygen-based etch gas that forms an oxide halide layer that is then removed by volatilization.

In a second embodiment of the invention, wherein the feature in need of editing is an organic-based inter-level dielectric feature, the process further includes locating the feature and providing a mask over the organic-based inter-level dielectric feature to expose a portion of the feature to be edited. This feature is then bombarded with electrons emitted from the electron beam and an etch gas is emitted over the bombarded organic-based inter-level dielectric feature. Dissociation of the etch gas on the organic-based inter-level dielectric by inelastic scattering with the low energy electrons forms active species that chemically etch unmasked areas of the ILD thereby editing the feature. The etch gas must have a high selectivity for the organic-based inter-level dielectric, such as, a gas including $H_2O$, $O_2$, $N_2O_2$ and $XeF_2$.

In a third embodiment of the invention, both a metallic interconnect feature and an organic inter-level dielectric layer in need of editing on the integrated circuit may be located. These features are then sequentially edited in accordance with the descriptions of the first and second embodiments of the invention.

In a second aspect, the invention provides another method for editing an integrated circuit by providing a vacuum chamber having a gas nozzle therein and inserting an integrated circuit within the vacuum chamber. Once in the vacuum, at least one feature in need of editing on the IC is located and then a gas is injected into the vacuum chamber through the gas nozzle. The gas provides adsorption of reactant molecules on a surface of the at least one feature in need of editing prior to interaction with an electron beam within the vacuum chamber. The surface of the at least one feature is bombarded with the electron beam whereby low-energy electrons inelastic scatter with the adsorbed reactant molecules on the surface of the at least one feature to induce reaction products thereon, which are then removed or added to edit the feature of the IC.

In this aspect of the invention, the gas may be a halogen or an oxygen-based gas for etching, or alternatively, an organo-metallic or TEOS gas for deposition. The gas dissociates by inelastic scattering with the low energy electrons to form active species on a surface of the at least one feature that are then removed by etching or added by deposition. These low energy electrons may be emitted from the electron beam itself, may be secondary low energy electrons emitted from the surface of the feature being edited, or may be a combination of electron beam emitted low energy electrons and emitted low energy electrons. Preferably, a constant vacuum of less than $10^{-5}$ Torr is maintained in the vacuum chamber to prevent damage to an electron beam source and optics.

In yet another aspect, the invention is directed to an apparatus for editing an integrated circuit. The apparatus includes a vacuum chamber and a gas nozzle within the vacuum chamber for injecting a gas into the vacuum chamber to provide adsorption of reactant molecules on a feature surface in need of editing therein the vacuum chamber prior to interaction with an electron beam. The apparatus also includes an electron column within the vacuum chamber for emitting the electron beam whereby low-energy electrons inelastic scatter with the adsorbed reactant molecules on the feature surface to form volatile byproducts on the feature surface that are easily removed while forming substantially minimal feature surface contamination and damage. Still further, the apparatus may include an ion beam column within the vacuum chamber for providing significantly higher rates of removal and anisotropy of the feature surface.

BRIEF DESCRIPTION OF THE DRAWINGS

Features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description, which, taken in conjunction with the accompanying drawings in which:

DESCRIPTION OF THE PREFERRED EMBODIMENT(S)

Figure 1:
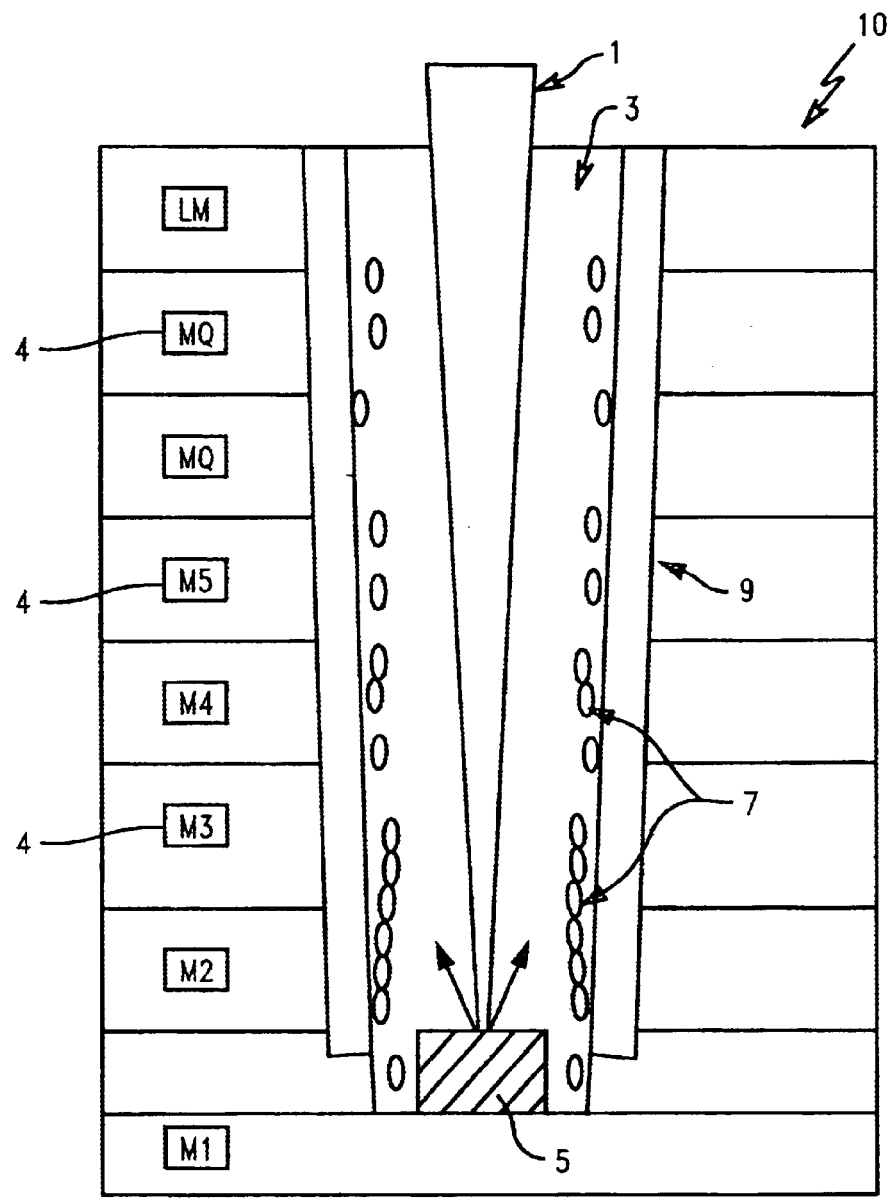
FIG. 1 illustrates a side view of a prior art FIB process for high-aspect ratio (deep-hole) repair sites in which undesired interconnect metal byproduct re-deposition and ILD damage occur.

In describing the preferred embodiment of the present invention, reference will be made herein to FIGS. 1–14 of the drawings in which like-numerals refer to like features of the invention. Features of the invention are not necessarily shown to scale in the drawings.

The present invention is directed to an apparatus and methods for repairing integrated circuits (ICs), wherein repairing encompasses the editing and prototyping of such ICs, using electron-beam-induced chemical processes that may be assisted with low-energy ions, or optically with focused light. The invention overcomes the above problems associated with conventional apparatus and techniques for repairing and editing ICs, such as liquid metal based focused ion beam (FIB) induced processes. These problems include, but are not limited to, IC electronic device damage, wafer surface contamination, re-deposition of conductive metal interconnect byproducts that can electrically short IC features, and damage of the preferably insulative ILD layers in so doing, the invention provides apparatus and techniques that enable the combined use of multiple ion, photon, and electron beams, and as such, attains the combined benefits of ion, photon, and electron beam processes. For example, the invention achieves the advantage of electron-beam processes, i.e., substantially no physical sputtering of conductive metal etch products, while also reducing damage to energetically sensitive ILD materials by using electron beams. Additionally, the invention achieves the benefit of faster reaction rates and higher anisotropy of created holes by using low energy (<5 keV) ion or plasma assisted electron beam processes.

The invention may be used to edit both those ICs having metallic interconnect features, such as copper features, as well as those ICs having organic inter-level dielectric layers, such as SiLK. It has unexpectedly been found that the use of either high or low energy electron bombardment of surface materials greatly modifies the properties of these surface materials in the presence of appropriate gas reactants, thereby enabling IC editing. For instance, electron-gas-surface interactions modify the IC materials by inducing chemical reactions, break chemical bonds, and cause the byproducts to be liberated from the original surface. In so doing, the use of electron beam exposure via SEM instrumentation for chip editing and repair allows for spatially selective thin film deposition and etching as a result of the ability to localize the electron radiation intensity.

Figure 2:
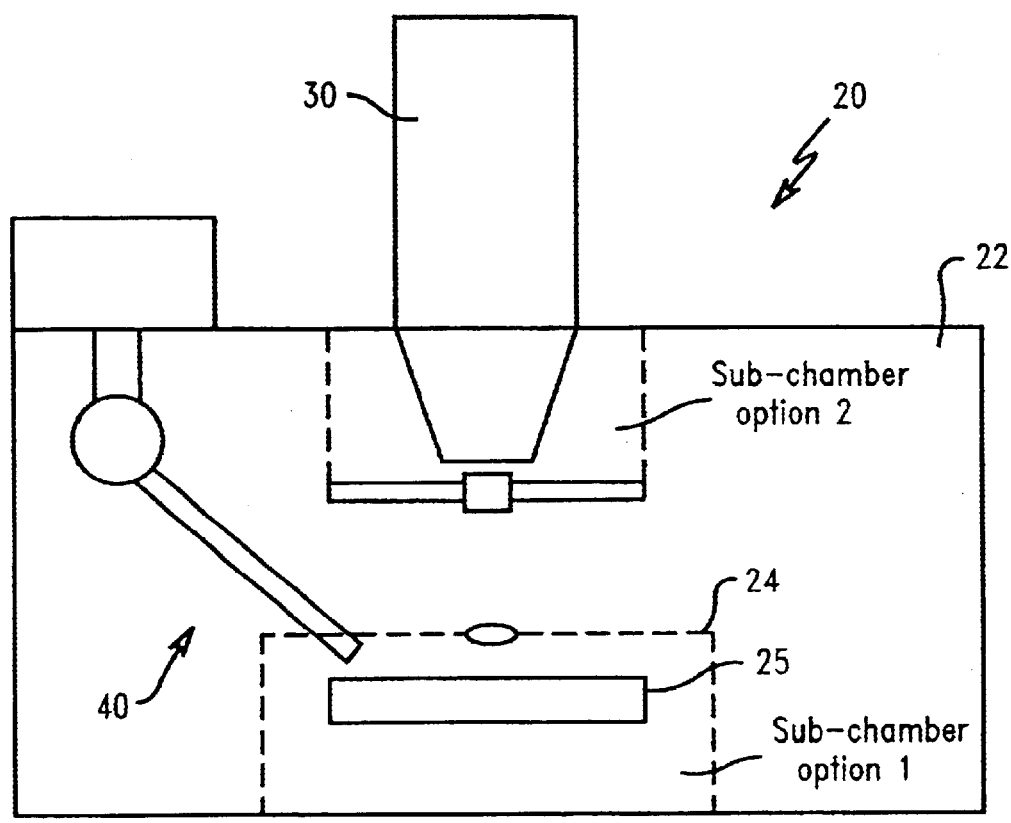
FIG. 2 illustrates a side view of an electron beam repair apparatus in accordance with a first aspect of the invention.

In a first aspect of the invention, a modified scanning electron microscopy (SEM) type tool for IC repair and editing is provided that achieves the foregoing advantages. As shown in FIG. 2, the modified electron beam (MEB) tool 20 is optimized to include operation at electron beam energies of less than or equal to 0.1 keV without substantial degradation of the electron spot size or current density on the sample surface.

Referring to FIG. 2, the MEB tool 20 for editing ICs 26 includes a main vacuum chamber 22 having a sub-chamber 24 entirely within the main chamber so that ICs in need of editing and reactant gases may be provided entirely within the sub-chamber for editing and repairing such ICs without affecting the vacuum level of the main chamber. A necessary component of the invention includes maintaining a consistent vacuum level of $P<10^{-5}$ Torr in the main chamber in order to prevent damage to the electron beam source and optics. For additional protection, differential pumping apertures may also be added inside the electron column to further isolate the source element of the electron column apparatus from gases that might escape from the sub-chamber into the main chamber.

The main vacuum chamber 22 may include normal components used for achieving SEM imaging functions, while the sub-chamber 24 may include gas, light, and low-energy ion/plasma sources as well as the sample to be edited. The MEB tool 20 may be used to edit and repair those ICs including interconnects made of various metals, inorganic oxide layers, organic ILD materials, and the like. Preferably, the sub-chamber 24 comprises an enclosure for containment of reactant gases having an aperture 28 for allowing electrons from the electron column 30 to pass into the sub-chamber and reach the sample surface for the purpose of editing and repairing the IC 26. A gas nozzle 40 is provided within the sub-chamber 24, whereby the gas nozzle may be a known nozzle including, but not limited to, hypodermic tubing or simply a manifold with holes surrounding the sample area to be modified. In the invention, gas nozzle 40 emits a gas within sub-chamber 24 in order to provide adsorption of reactant molecules to the surface prior to interaction with the electron beam. These gases emitted within sub-chamber 24 include $XeF_2$, $H_2O$, $O_2$, $I_2$, $Cl_2$, for etching processes and various metallic precursors for intentional deposition of conductors, or alternatively, TEOS or carbon for deposition of insulator layers.

In accordance with the invention, the MEB tool 20 edits an IC within sub chamber 24 by either low or high-energy electron induced activation of adsorbed gases that cause etching and removal of surface materials on the IC. In so doing, the electron beam is created by using higher acceleration voltages (i.e. greater than or equal to 5 kV) only within the electron column 30. Electrons in the beam are then slowed electrostatically to significantly lower energies, such as those having energies less than or equal to 1 keV, by providing retardation fields at the sample surface. The reactant gas molecules are introduced to the same region as the electron beam spot, adsorbed onto the surface, and dissociated or activated by the electrons through inelastic scattering.

Figure 3:
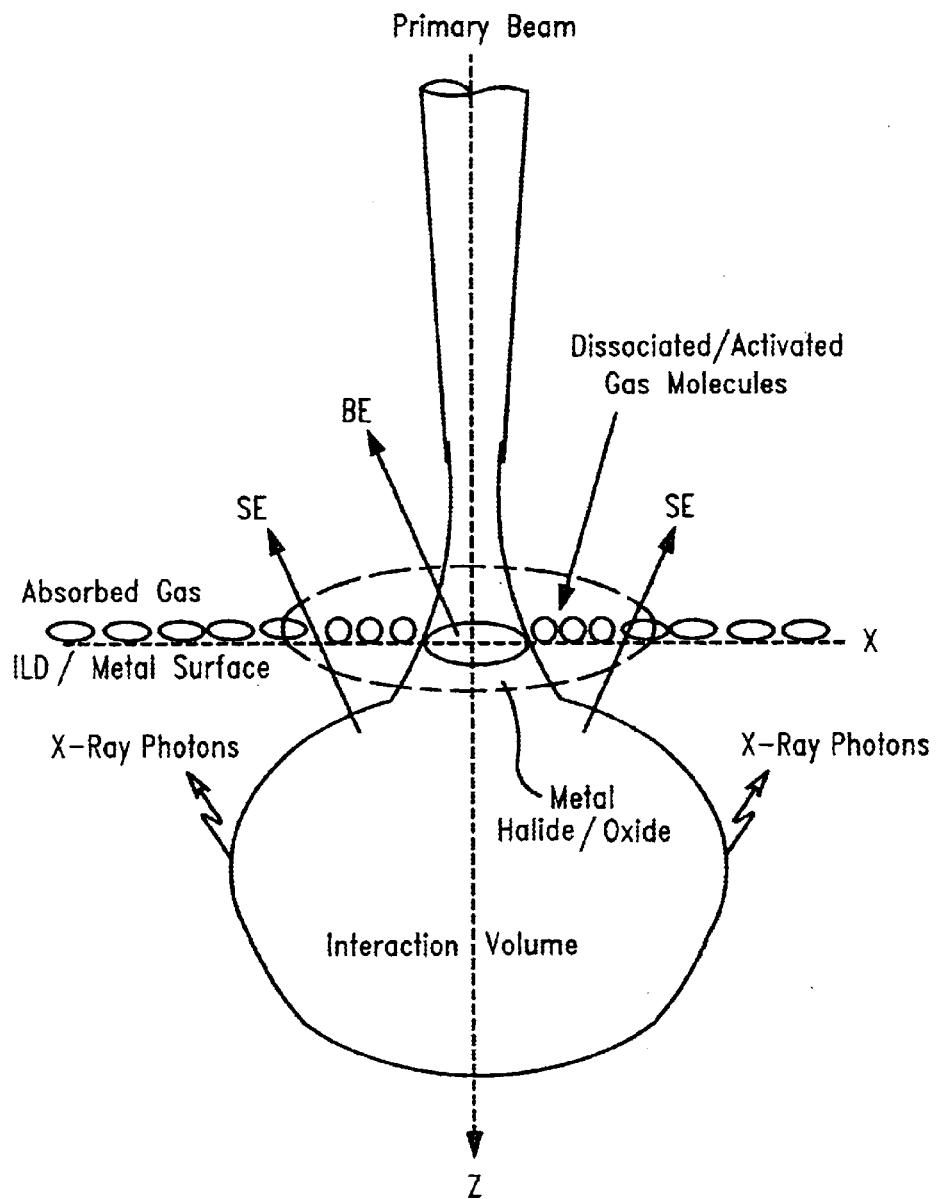
FIG. 3 illustrates a side view of an electron beam to sample interaction and subsequent adsorbed gas activation.

As shown in FIG. 3, electrons are emitted from a small source and spatially filtered using apertures to define a spot that is focused on the sample by electromagnetic lenses in the column. The region where the electrons are most tightly focused (referred to as the "spot") and coincident upon the sample surface is shown in FIG. 3 cross-sectionally and is labeled as "primary beam" (which is actually only the final portion of the overall primary beam that extends up the column all the way to the source, where it originates). Conventional SEM tools have good resolutions at energies ranging from 2 keV to 100 keV, however, the resolutions of these conventional tools degrade as the electron beam energies are lowered below 2 keV. In accordance with the invention, it has now been unexpectedly discovered that the instant modified electron beam (MEB) tool 20 provides superior resolutions as the electron beam energies are lowered below 2 keV, preferably <1 keV, more preferably less than or equal to 0.1 keV, due to the increased scattering cross-section with lower electron energy. A critical aspect of the invention is that initiation of a chemical reaction primarily depends on inelastic scattering between electrons of the beam and adsorbed gas molecules on the surface of the feature being edited, as illustrated in FIG. 2.

Another critical aspect of the instant ion beam sputter assisted removal of reaction products is that the smaller scattering cross-section of electrons, and hence probability of interaction with gas molecules, is orders of magnitude less than those for the conventional gallium ion atoms. In so doing, an important feature of the invention is that a primary electron beam (either low-energy or high-energy) contacts the surface of the feature being edited to generate (or emit) low-energy secondary electrons from the sample surface. These low-energy secondary electrons will then interact with the adsorbed reactants on the surface of the feature thereby editing the integrated circuit. The primary electron beams may have high energies, such as those >5 keV, that do not effectively interact with the reactant gas molecules before interaction with the surface. However, these high-energy electrons do strongly interact with the sample surface atoms causing emission of the low-energy secondary electrons, as well as X-ray photons. The secondary low-energy electrons of the invention have energies less than or equal to 0.1 keV, whereby these secondary low-energy electrons significantly interact with the adsorbed gas molecules to edit the IC. In accordance with the invention, another advantage of indirectly generating low-energy secondaries from the sample interaction volume using an initial primary beam having higher energies is that the electron column performance is not compromised and smaller spots with higher current densities can be achieved.

In a second aspect of the invention, the modified electron beam (MEB) apparatus and processes are used for the complete removal of metal features, such as copper, during repair and editing processes of ICs having such interconnect features. In editing these metal features, it has been found that chemical etching is preferable as it avoids mechanical sputtering of such metal features and the subsequent re-deposition of byproducts associated therewith. The complete removal of metal and ILD features is achieved by the use of the instant electron beam irradiation of surface materials whereby such focused electron beam induces chemical reactions at these surfaces enabling IC repair and editing. It avoids the need of using conventional much more massive gallium atom ions through mechanical ion milling and sputtering components, and as such, avoids the problems associated therewith.

Figure 4:
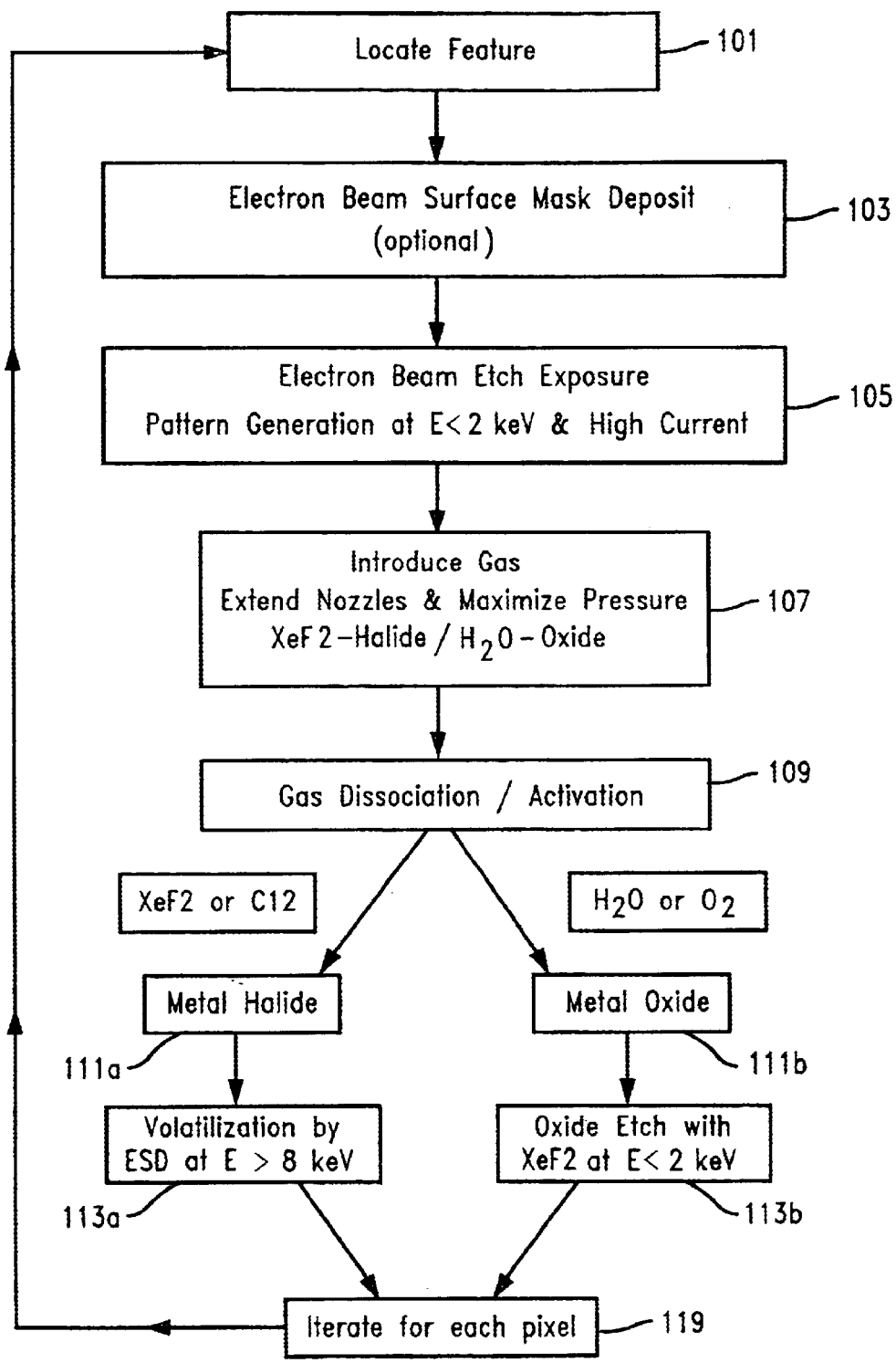
FIG. 4 illustrates an exemplary process flow of the invention for electron beam based editing of metal interconnect features during chip repair.

The process flow of using the MEB apparatus for the complete removal of metal features during editing of ICs having such metal features is shown in FIG. 4. In accordance with the invention, an IC having a metal feature in need of modification and/or editing is first provided within the sub-chamber 24 of SEM tool 20. The metal feature may be located in a deep hole in the IC or on a surface of the IC. As shown in FIG. 4, the metal feature is located on the IC (step 101). Once located, a mask may optionally be formed over the metal feature for exposing only the metal feature to the electron beam (step 103), as discussed further below. The copper feature is then exposed to the electron beam for electron beam induced etch exposure (step 105). The low energy electrons provided for activation of the gas reactant could either be directly from the initial primary beam, or preferably, indirect generation of secondaries emerging from the sample as a result of the high-energy primary beam electrons scattering with atoms in the IC feature. In so doing, the metal feature is exposed to the low-energy electrons having energies less than 2 keV at a high current, such as a current ranging from about 10 picoampere (pA) to about 100 nanoampere (nA). Once the metal feature is exposed to the low-energy electrons, an etch gas is introduced into the sub-chamber at the same time in order to react with atoms of the metal to form metal halide or metal oxide products (step 107). Next, a different etch gas may optionally be introduced into the sub-chamber 24 in order to etch and volatilize the more reactive metal halide/oxide product formed in the previous step. The etch gases introduced into the sub-chamber may include halogens, such as $XeF_2$, $XeCl_2$, and $I_2$ or oxygen-based, such as, $H_2O$ and $O_2$ that are introduced into the sub-chamber at room temperature and at pressures ranging from about $10^{-5}$ Torr to about 1 Torr.

In accordance with the invention, wherein the initial reactant is a halogen gas, the process flow of the invention continues to step 111*a* whereby the exposed metal surface reacts with the activated halogen gas to form a metal halide, (i.e., a copper halide in the case of Cu based ICs). The dissociation of halogen gases on metallic surfaces, such as copper, by inelastic scattering with electrons results in the formation of the metal halide surface outer layers. These activated reactants spread out over the spatial extent referred to as the lateral reaction range in FIG. 5(*a*). Thus lateral reaction range is due to either diffusion of activated species or de-localization of the low-energy secondaries.

Figure 5A:
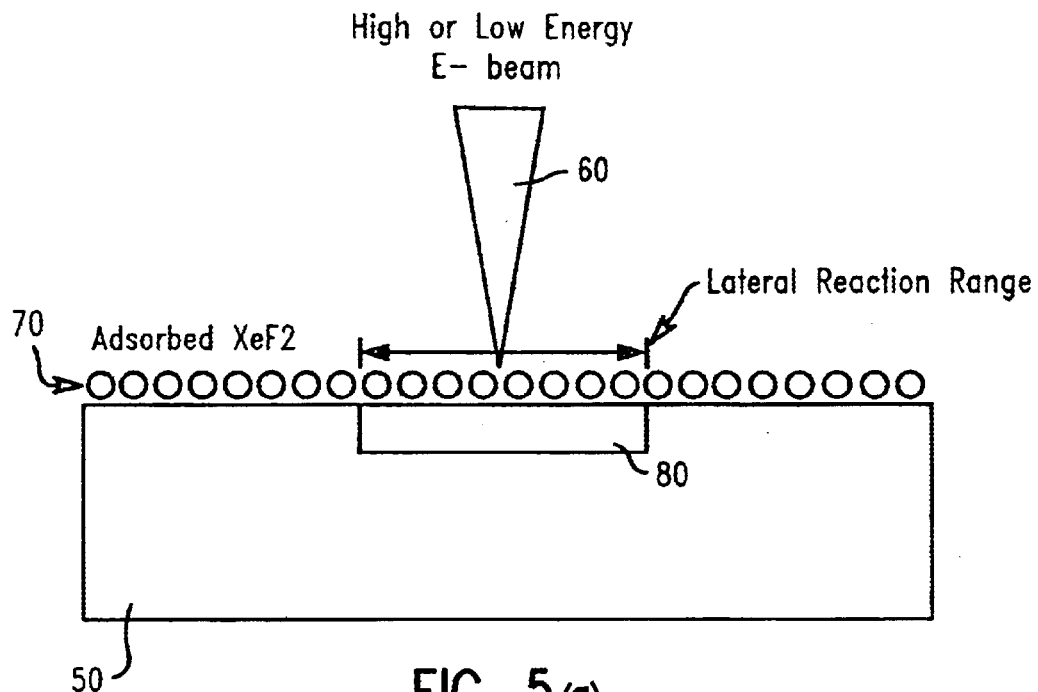
FIG. 5(a) illustrates a side view of the formation of a metal halide layer on an interconnect feature in accordance with the invention.
Figure 5B:
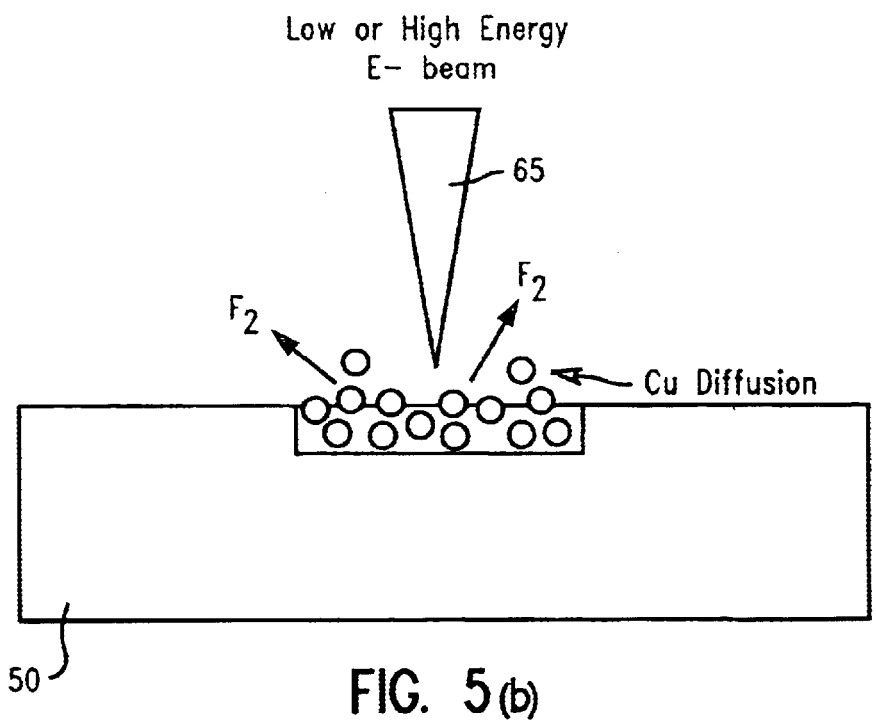
FIG. 5(b) illustrates a side view of the volatization of the metal halide layer of FIG. 5(a).
Figure 6A:
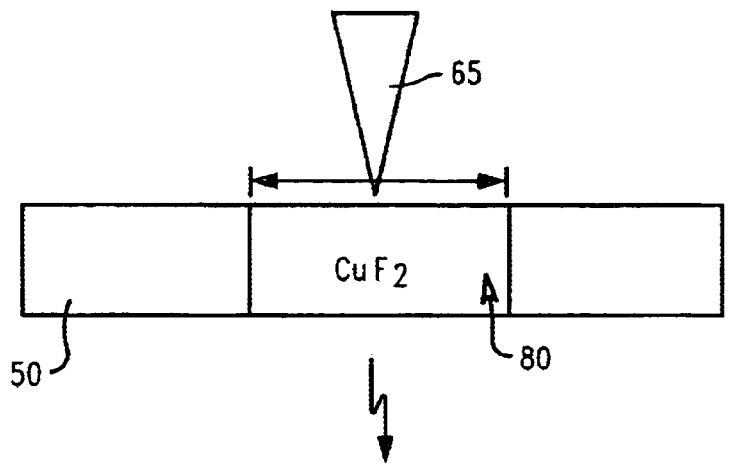
FIGS. 6(a)–(d) illustrate a sequence of top plan views of the copper feature during the volatization process of the metal halide layer of FIG. 5(b).
Figure 6B:
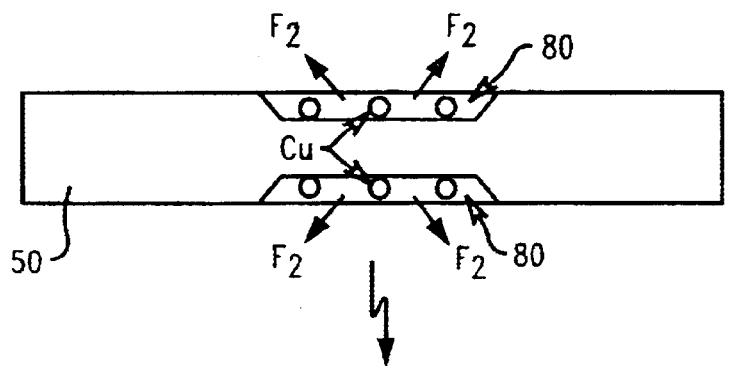
Figure 6C:
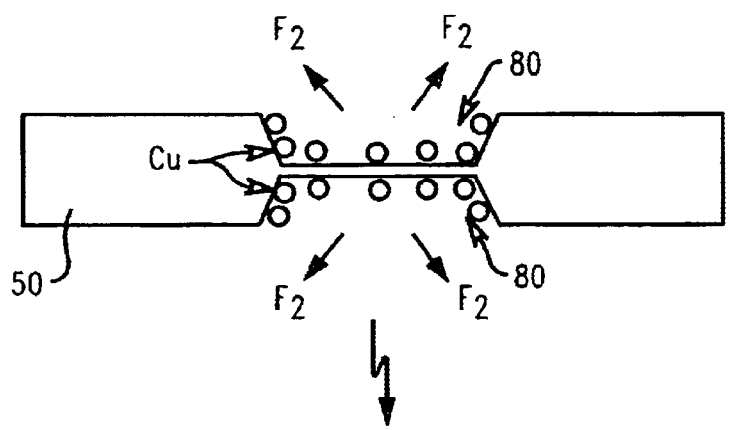
Figure 6D:
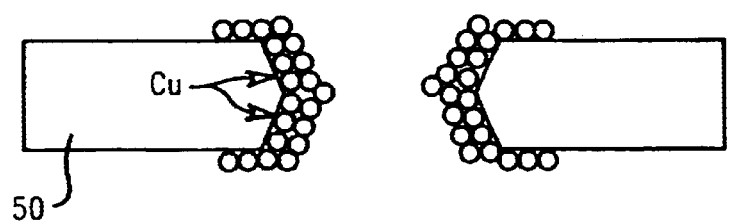

For example, as shown in FIG. 5(*a*), a copper feature 50 of an IC (not shown) is bombarded with the primary electron beam 60. A halogen gas 70 is introduced into the sub-chamber, via nozzle 40, whereby the halogen gas 70 molecules are activated through scattering either with electrons from a low energy primary beam or secondaries emerging back out from the surface after being generated by a higher energy primary electron beam. In both cases, low-energy electrons interact with the halogen gas molecules adsorbed on the metal feature surface in order to form a metal halide layer 80 at a top surface of the metal interconnect feature. That is, the copper feature 50 is bombarded with a low-energy electron beam 60 whereby a halogen gas, $XeF_2$, contacts the surface of the copper feature and is dissociated by the electron beam 60 to form $CuF_2$ layer 80. The formation of this metal halide layer 80 is a critical step in the instant process of chip editing as the metal halide product can be more easily volatilized than the initial copper feature itself.

After the metal halide layer 80 has been formed on the metal feature 50, it is volatized by high-energy electron beam exposure for patterning, i.e., electron stimulated desorption (ESD) or radiolysis, in order to edit the chip interconnect feature (step 113*a*). In the case of metal halides, the volatilization occurs from exposure to photons having initial energies greater than 1 keV (X-rays). Metal halide products can also be evaporated off the surface if enough feature heating can be generated by the primary electron beam current. In the case of ESD, the high-energy photons are generated by electrons from a high-energy electron beam 65 at energies greater than 8 keV, for the case of copper fluoride removal. As primary electrons enter the copper feature volume 50 and the metal halide layer 80, they are dramatically slowed by nuclei within the sample interaction volume. This slowing of electrons produces the x-ray photons, which cause the metal halides to desorb from the surface. Referring to FIG. 5(*b*), the volatilization of this metal halide layer causes the gas molecules, i.e., the fluorine ($F_2$) molecules, to be liberated from the surface of the metal halide layer and the metal atoms, i.e., copper atoms, to be diffused away from the original copper feature thereby resulting in a cut and/or edited copper feature.

As can be further seen in the top plan views of FIGS. 6(*a*)–(*d*), once the metal halide layer 80 is formed at a top surface of the copper feature 50 (FIG. 6(*a*)), the high-energy electron beam 65 generates the photons and begins to liberate the gas molecules and dissociates the metal atoms (FIG. 6(*b*)). As the volatization process continues, the photons and the metal atoms continue to be liberated (FIG. 6(*c*)) until the metal is removed (FIG. 6(*d*)) thereby editing the copper feature by the complete removal of copper therefrom. The clean exposed copper surface is then converted into another copper fluoride layer using the first low-energy electron exposure step in order to continue the copper removal process. That is, the steps involving metal halide formation by halogen gas dissociation and subsequent desorption or evaporation are iterated until no copper remains at the site of interest being edited. This process is repeated for each feature located on the copper feature in need of repair and editing (step 115).

Alternatively, referring to the process flow of FIG. 4 again, the complete removal of metal for editing and repairing interconnect features may be accomplished by formation of a metal oxide layer and subsequent chemical etching of such metal oxide layer. In this embodiment, the gas provided within the sub chamber 24 (step 107) may include an oxygen-based gas such as, for example, $H_2O$ or $O_2$ to form an oxide layer on the metal feature. Low-energy electrons are introduced to the metal surface (either by low energy primary beam exposure or as secondary electrons generated by a higher energy primary beam) and the oxygen-based gas is provided within the sub-chamber 24 whereby dissociation or activation of the oxygen-based gas occur (step 109) to form the metal oxide layer on the interconnect feature (step 111*b*).

Reaction rates and oxide formation can be accelerated increasing the amount of oxygen-based gas delivered to the surface (i.e. pressure) until all of the electrons are scattered by adsorbed molecules of the gas. After that point there would be no reason to deliver more gas or increase the pressure. Heating the surface would actually decrease gas adsorption to the surface and counteract any benefits that might be gained through increase of thermal energy. However, cooling the sample might improve adsorption rates and the supply of reactant on the metal surface without having to increase the initial gas delivery or pressure. Again in accordance with the invention, the dissociation of the oxygen-based gases by inelastic scattering with low-energy electrons directly in contact with the metallic surface of the feature in need of editing results in the formation of the metal oxide surface outer layer.

Figure 7A:
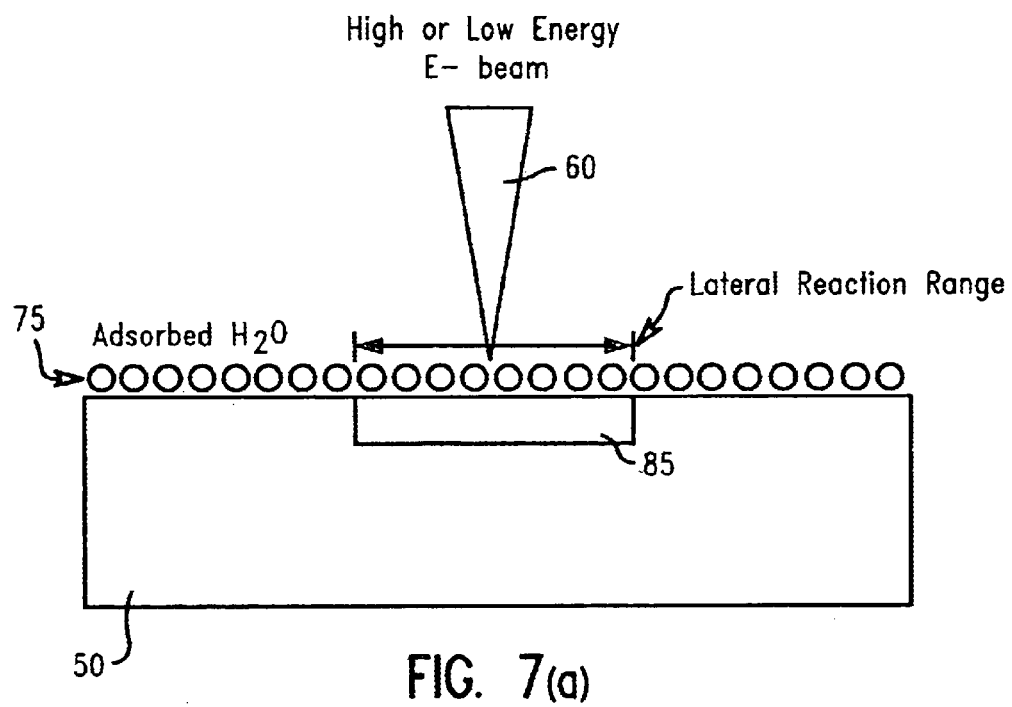
FIG. 7(a) illustrates a side view of the formation of a metal-oxide layer on an interconnect feature in accordance with the invention.
Figure 7B:
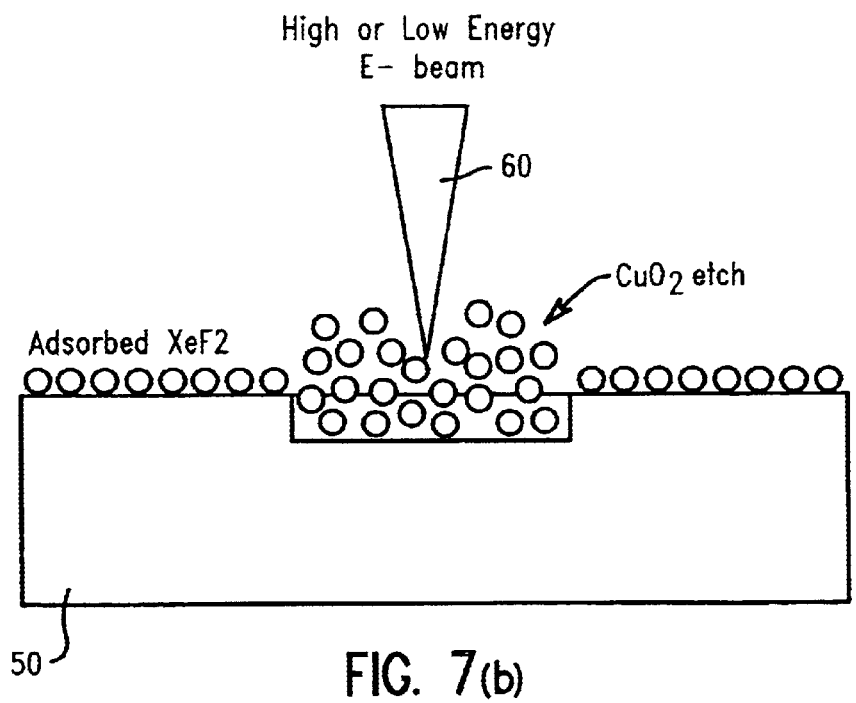
FIG. 7B illustrates a side view of FIG. 7A showing the volatilization of the metal oxide layer by low-energy beam exposure of a reactant gas.

As shown in FIG. 7(*a*) the metal oxide layer 85, i.e., copper oxide layer 85, is formed by the dissociation of an oxygen-based gas at low electron energies via low-energy electron primary beam exposure 60 at the surface of the metal feature 50. Once the metal oxide layer 85 is formed, the metal oxide layer 85 is volatilized by dissociation of a second gas, such as a halogen gas including $XeF_2$, $CF_4$, $SF_6$, and the like, preferably at low electron energies via low-energy electron primary beam or indirectly with secondaries emitted from the surface after generation by a higher energy primary beam 60. (step 113*b*). FIG. 7(*b*) illustrates the volatilization of the metal oxide layer 85, such as $CuO_2$, by low-energy electron beam exposure of a second reactant gas (halogen), i.e., those energies less than 2 keV, via the low-energy electron beam 60. The volatilization of the metal oxide layer occurs by the exothermic reaction whereby the volatilized products are able to leave the surface without subsequent energy being supplied for desorption or evaporation. The two-step sequence is repeated iteratively until all of the initial metal has been removed. Referring to FIG. 4, this iterative process is repeated for each feature located on the IC in need of repair and editing (step 115).

Figure 8:
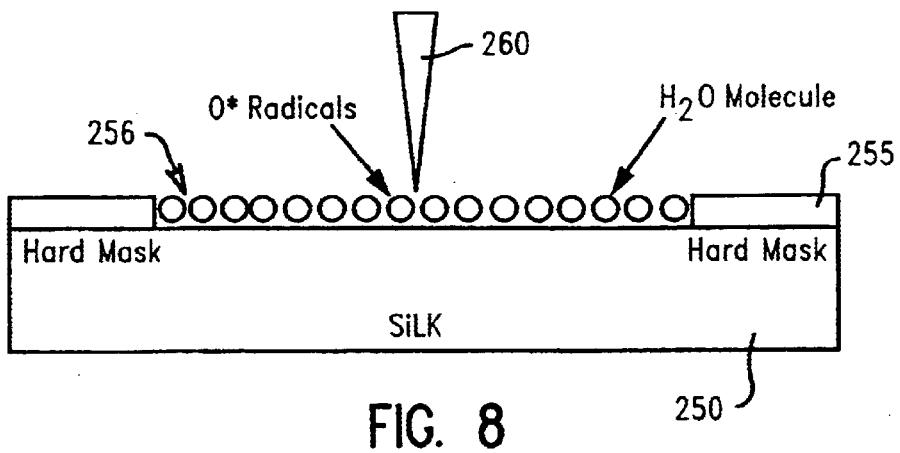
FIG. 8 illustrates the instant electron beam based etching of organic ILD material by dissociation of adsorbed $H_2O$.

In a third aspect of the invention as shown in FIG. 8, the electron beam induced chemical etching apparatus and processes may be used to edit those ICs having organic features, and in particular, for the non-invasive removal of organic based inter-level dielectric (ILD) materials during integrated circuit repair and editing. In so doing, the use of the beam of electrons induces a chemical etching reaction for the removal of organic based ILD materials that avoids undesirable surface damage, resultant current leakage, graphitization and contamination of the organic ILD material. Advantageously, the low-energy electron induced chemical etching allows for the removal of organic based ILDs having thickness ranging rather than those techniques, such as ion milling using gallium, which cause more damage to the ILD materials and hence can incur undesired electrical leakages.

Figure 9:
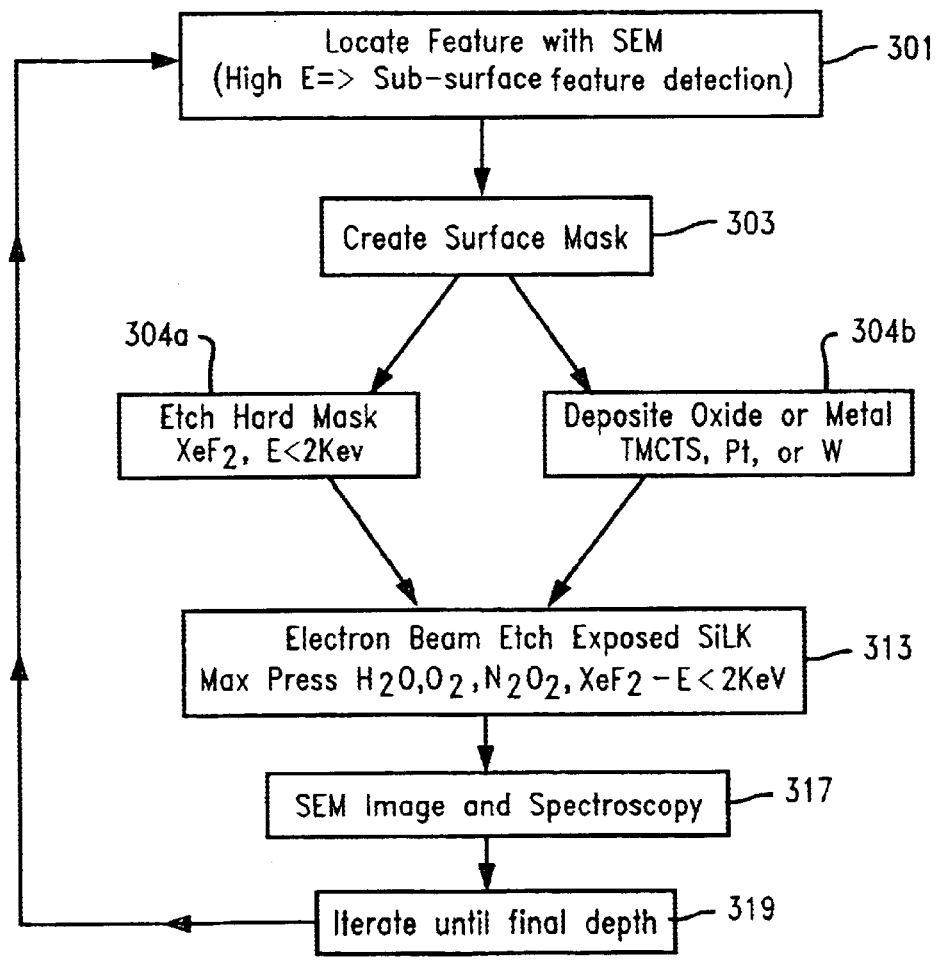
FIG. 9 illustrates an electron beam based repair process sequence for etching of an organic inter-level dielectric chip, such as SiLK ILD.

Referring to FIG. 8, an organic based ILD 260, such as a low-k dielectric layer of SiLK, having a hard mask layer (typically oxide and/or nitride) 255 deposited directly thereover may be etched using electron beam 260. The process flow of using the modified electron-beam-induced (MEB) chemical apparatus for the removal of organic based inter-level dielectric materials during IC repair and editing is shown in FIG. 9. In accordance with the invention, an IC having the organic based inter-level dielectric material in need of repair, prototyping and/or editing is first provided within the sub-chamber 24 of SEM tool 20. As shown in FIG. 9, the organic based ILD material is first located on the IC, such as, by high-energy electron beam sub-surface feature detection (step 301). Once located, a mask may optionally be formed by electron beam induced deposition of oxide over the organic based ILD material for exposing only the organic based ILD material to be removed to the electron beam induced etch process (step 303). Wherein the organic based ILD 260 layer has a hard mask layer 255 thereover, the existing hard mask layer may be etched and patterned by providing a halogen (e.g. $XeF_2$) gas thereover the hard mask in combination with the use of the electron beam having energies less than 2 KeV to dissociate the halogen and form an aperture 256 within the hard mask layer 255 (step 304a). The aperture 256 exposes a portion of the organic-based ILD material for further processing. Alternatively, an electron beam deposited hard mask may be locally created if one does not already exist in the area being processed.

Once the portion of organic based ILD material to be removed is exposed by process step 304a or 304b, it is then etched using the electron beam (step 313). In so doing, a gas is provided within the sub-chamber whereby dissociation of such gas on the organic based ILD material by inelastic scattering with electrons forms active species that chemically etch and remove the surface of the organic based ILD material. The gases may include $H_2O$, $O_2$, $N_2O_2$, $XeF_2$ and the like, whereby such gases are introduced into the sub-chamber and adsorbed onto the sample surface for dissociation by the electron beam via either primary or secondary electrons at energies less than 2 KeV into active species. These active species of the dissociated gas cause volatilization of the organic based ILD material thereby removing the organic based ILD material. Optionally, the region of organic ILD material being removed may be illuminated with light photons in order to further improve etch reaction rates. The results are then observed through SEM imaging. This process continues until the desired amount of organic based ILD material is removed or the desired depth into the organic based ILD material is reached (step 319). The organic based ILD material is etched to complete removal and the hard mask layer of the underlying interconnect level has been reached. In so doing, an etch reactant for the organic ILD material is chosen that has high selectivity for the organic material and does not attack the underlying hard mask layer so that the etch process stops on such underlying hard mask layer. In accordance with the invention, the electron beam produces a chemical etch rate that is faster than any occurrence of surface damage, i.e., no surface damage occurs.

Still further in a fourth aspect of the invention, the instant process and apparatus may be used to edit those ICs having both copper features in combination with organic features. In these ICs, the copper features and the organic layers may be edited using the apparatus and process steps as described in detail above whereby the process flow is a sequential combination of the two electron beam processes for copper and organic ILDs. Accordingly, the sequential processing steps may include editing copper features and then editing organic ILDs, or alternatively, the sequential processing steps may include editing organic ILDs followed by editing copper features.

Figure 10A:
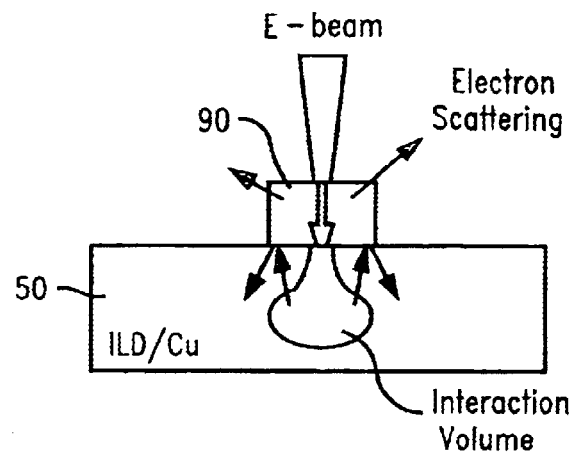
FIG. 10(a) illustrates a side view of formation of an electron beam deposited surface mask.
Figure 10B:
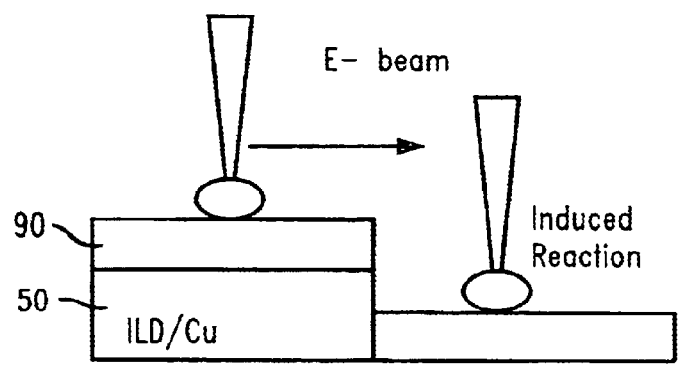
FIG. 10(b) illustrates a side view of the surface mask created in FIG. 10(a).
Figure 10C:
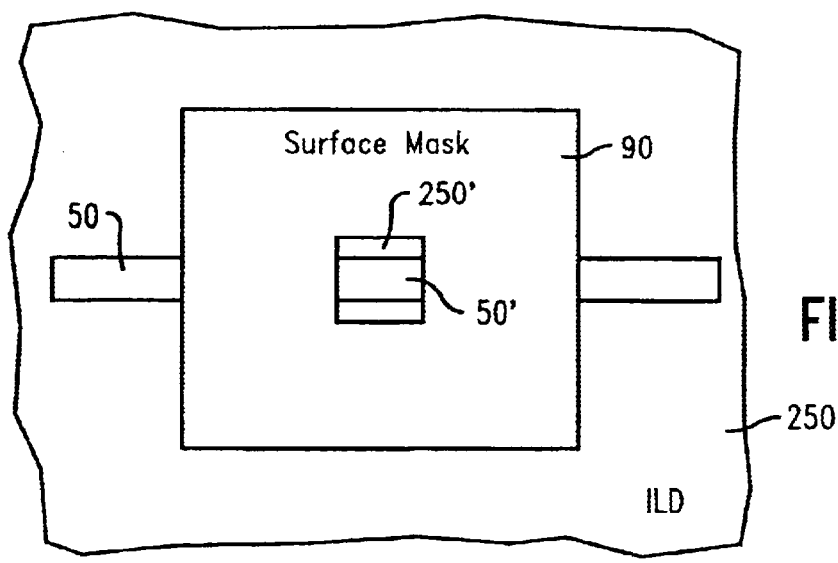
FIG. 10(c) illustrates a top plan view of the surface mask created in FIG. 10(a).

Referring to FIGS. 10(a)–(c), once the copper and/or the organic-based ILD features in need of editing are located in process flow steps 101, 301, a mask 90 may be formed over the copper feature and/or organic-based ILD feature for exposing only the exposed copper and/or organic-based ILD features to be modified with the electron beam induced process flow steps 103, 303 of FIGS. 4 and 9, respectively. In so doing, it has unexpectedly been found that the electron beam induced deposition of a masking material, via low-energy beam 60 and/or high-energy beam 65, can mask portions of copper and/or organic-based ILD features not intended for removal thereby confining the electron beam induced reactions. That is, as illustrated in FIG. 10(c), only exposed portions of the copper feature 50' and exposed portions of the organic-based ILD feature 250' will be processed for editing in accordance with the invention. The mask 90 may comprise an oxide, organic, or metal mask, and may be deposited by electron beam induced deposition techniques, such as, by using masking materials including TEOS, platinum, tungsten, carbon, and the like.

As shown in FIG. 10(a), it has advantageously been found that these low-energy electron beam induced deposition processes are more spatially localized, protect any adjacent ILD surface areas and provide improved masks that have well defined edges and sharpness as a result of the small volume created by such deposition processes "stealing" (diverting) the primary electron beam current before such current can interact with the copper and/or organic-based features. These small volumes that divert the primary electron beam current before interaction with the sample decrease the interaction volume and thus generation of any contaminants, surface damage, or undesired reactions (i.e. improve spatial confinement of the reaction). Interaction volume is the space where the initial primary beam electrons scanter and interact with atoms inside the sample material whereby the depth of this volume is typically less than 100 nm for the electron energies in accordance with the invention.

FIG. 10(b) illustrates a cross-sectional side view of mask 90. As shown, the etching of the lower lying ILD is prevented by the deposited surface mask 90, while the ILD layer not protected by mask 90 is exposed for removal. As shown in FIG. 10(c), the electron beam can be used to create a mask over those IC surface areas in need of modification that have both copper and organic-based ILD features, wherein those portions of such features covered by the mask 90 are isolated and protected from any changes. Wherein the IC does contain organic-based ILD features in need of repair and edit, the surface mask may comprise either an opening etched into hard mask layer 255 by electron beam etching (step 304a) or the mask may be created by electron beam induced deposition of-either an oxide, organic, or metal hard mask layer (step 304b).

Figure 11:
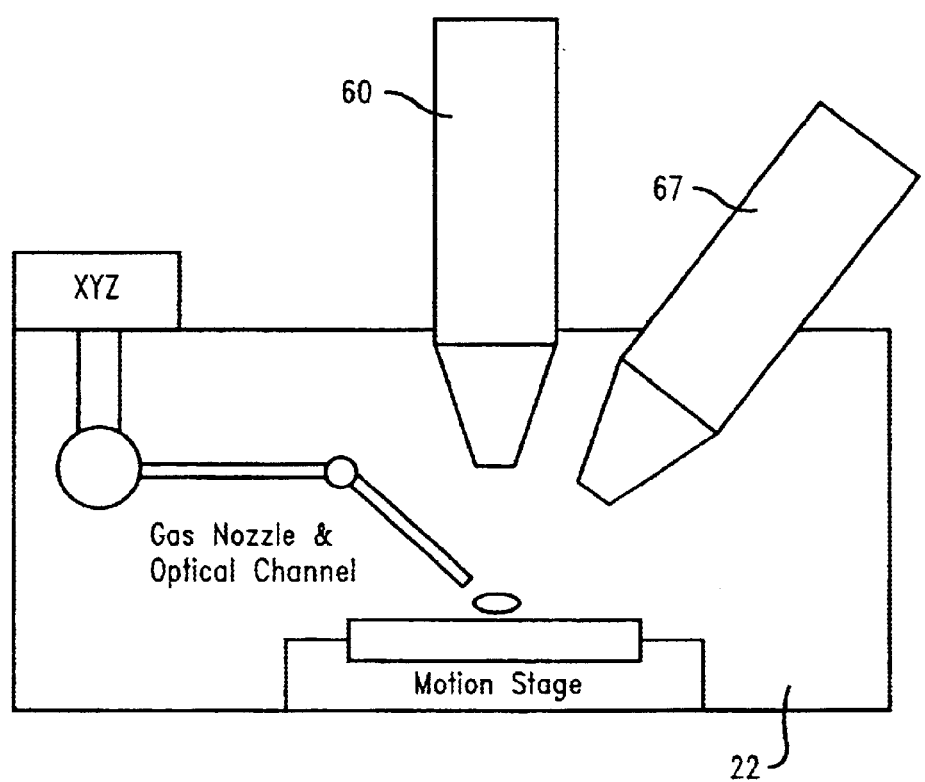
FIG. 11 illustrates a side view of a combined low-energy electron beam and ion beam apparatus in accordance with the invention.

In still a further aspect of the invention, the modified electron beam induced chemical apparatus and processes, which provide for minimal surface damage and no contamination due to the non-invasive nature of the low-to-moderate energy electron beam induced chemical etching, can be combined with ion based material removal techniques, which provide for higher rates and anisotropy, in terms of material removal (electron beams perform deposition better than ion beams), in order to achieve the combined advantages of these two processes. As depicted in FIG. 11, the instant low-energy electron beam column 60 may be merged with an ion beam column 67 which may include a liquid metal-based or a plasma source providing low-energy ions of various elements, such as, reactive O– or inert Ar+) into the single processing chamber 22 in order to realize the advantages of each technique in the processes of editing those ICs that have copper and/or organic-based ILD features. The ion beam column 67 may include FIB, mechanical milling in parallel with gas-assisted etching (GAE), and the like. As shown in FIG. 11, the XYZ coordinate is a positioner for the gas delivery nozzle, while the black dot is a point at which both beams coincide and the sample is moved by the motion stage with respect to both beams.

Figure 12:
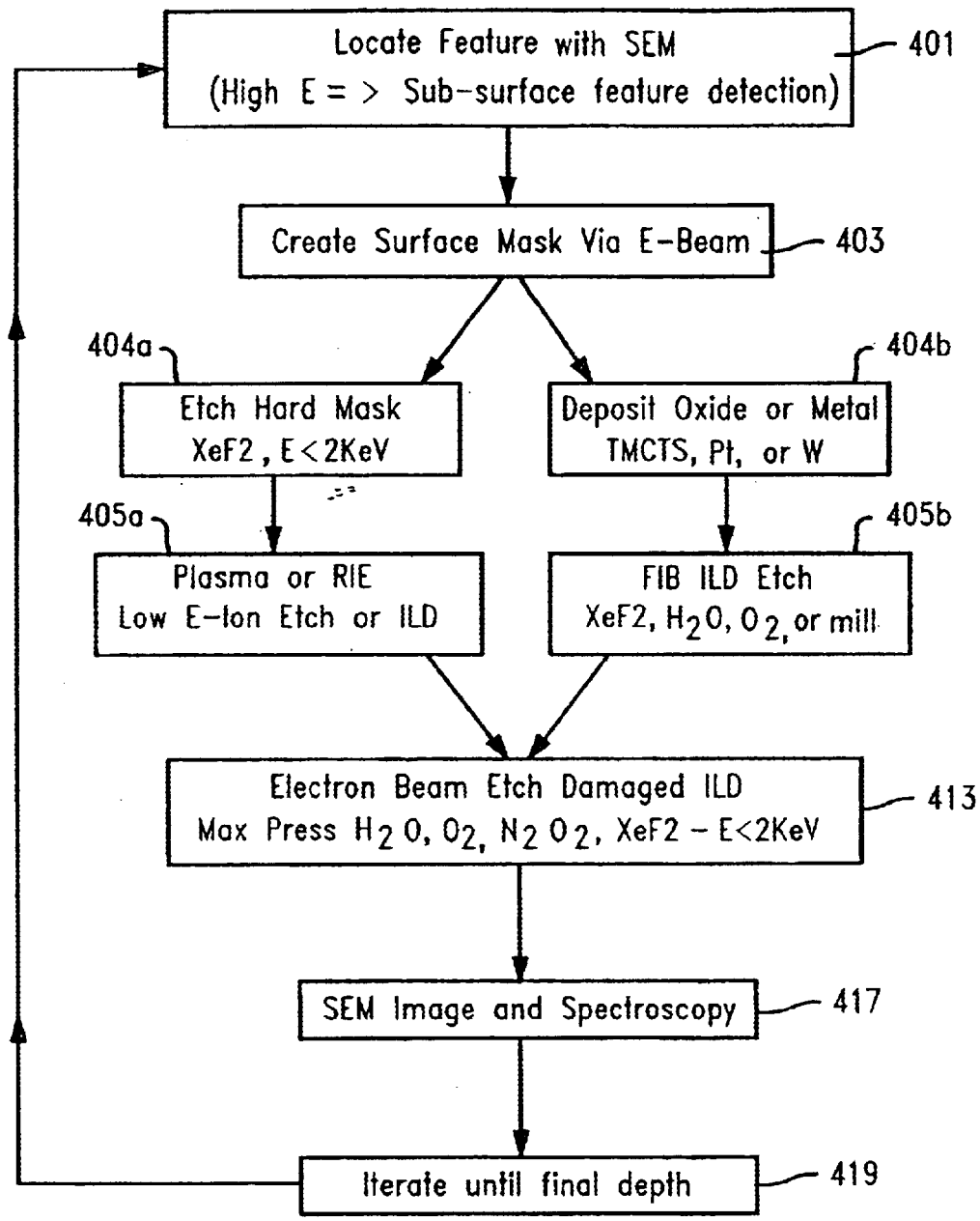
FIG. 12 illustrates a process flow of editing and repairing an IC having an organic-based ILD feature using the combined low-energy electron beam and ion beam apparatus of FIG. 11.

FIG. 12 shows the process flow of using the combined electron beam and ion beam apparatus of FIG. 11 to edit and repair an IC having an organic-based ILD material. The organic-based ILD layer region is first located (step 401) and then a surface mask is created using the electron beam (step 403) and patterned to protect adjacent areas from subsequent ion exposure, while providing access to the area that is to be processed (steps 404a or 404b). Either localized plasma etching or reactive ion etching (step 405a) or FIB etching (step 405b) can then be used to remove the unprotected ILD material until the access hole has the desired depth. An electron beam induced chemical etch process is subsequently performed (step 413) to remove and "cleanup" the relatively thin damaged ILD surface layer resulting from the previous ion mill step. In so doing, the etch rate, localization, and anisotropy are primarily determined by surface mask step 403 and ion beam steps 405a or 405b so that requirements on the electron beam etch process are relaxed. However, removal of conductive damaged ILD layers, and hence good electrical isolation, are made possible by the instant complimentary low-energy electron induced etch process. The surface mask created by the electron beam induced processing prior to ion exposure also minimizes the amount of damaged ILD to be initially cleaned-up. The amount of ion beam induced damage and contamination can further be minimized through use of low-energy non-gallium ion beam sources. Once a first layer of the conductive damaged ILD layers is removed in accordance with this process, remaining underlying damaged ILD layers are removed and the instant process is repeated until all of the damaged ILD layers are removed. The process is repeated for each damaged ILD layer located on the IC in need of editing.

Figure 13:
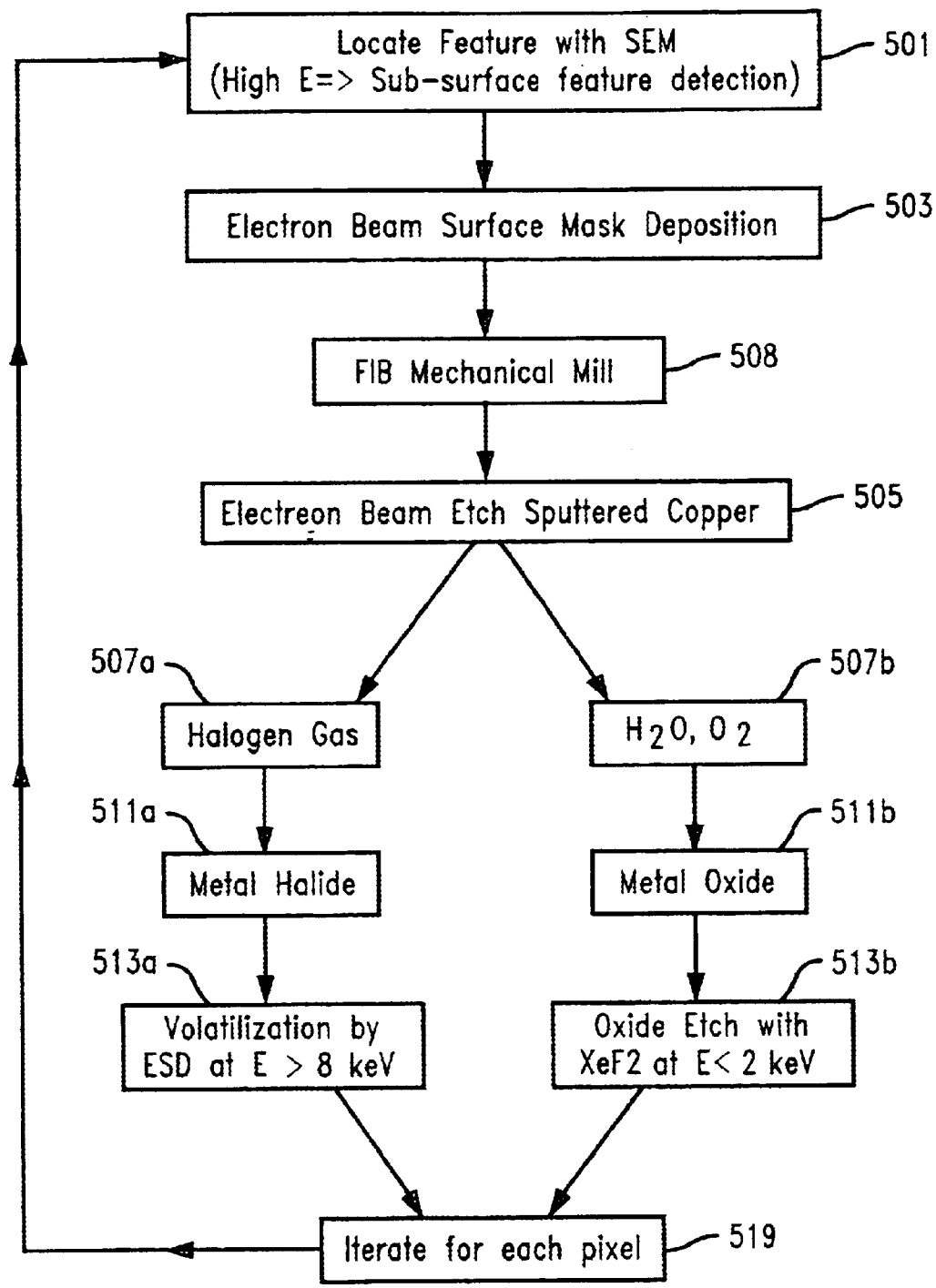
FIG. 13 illustrates a first process flow of editing and repairing an IC having a copper feature using the combined low-energy electron beam and ion beam apparatus of FIG. 11.
Figure 14:
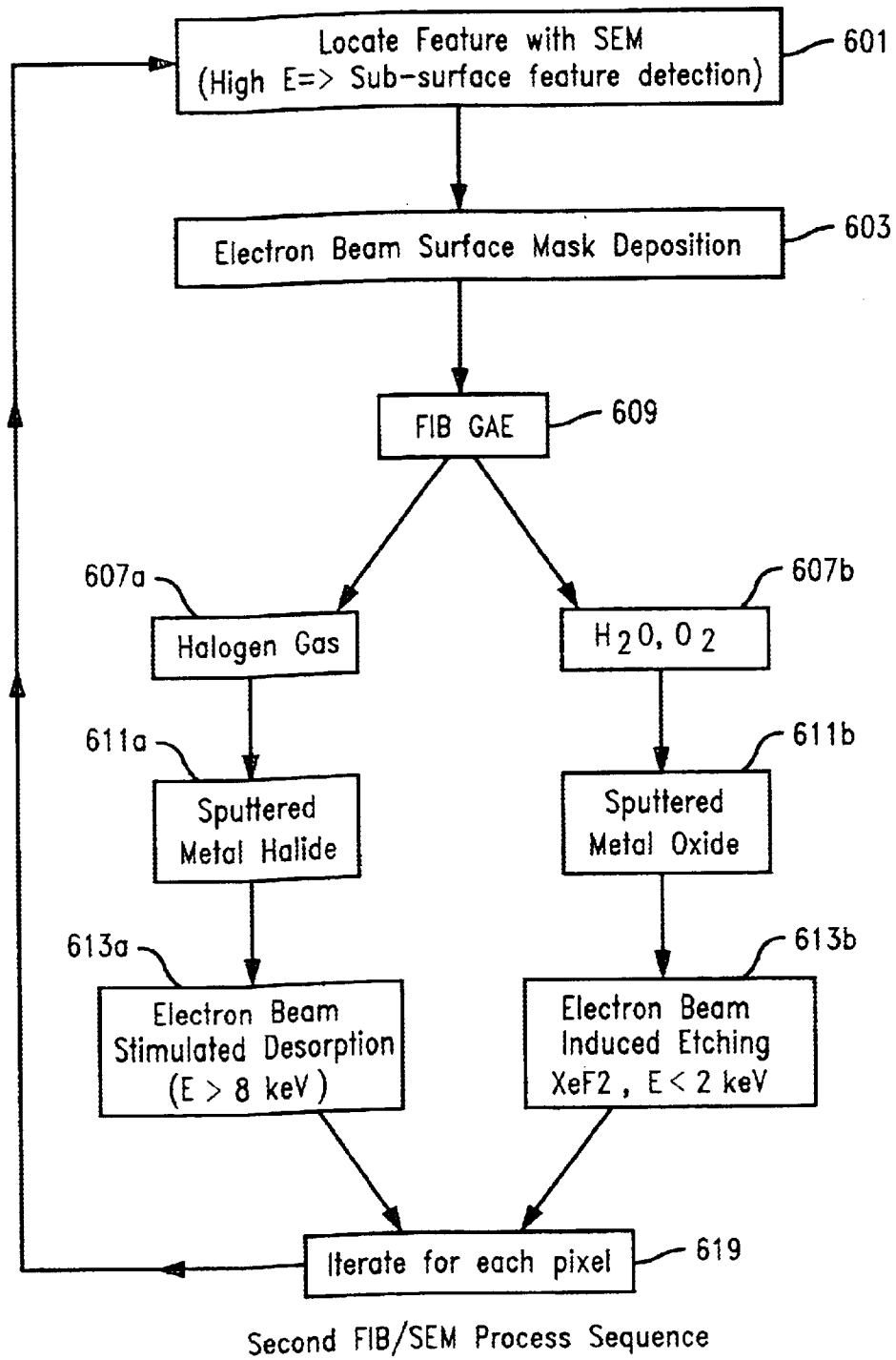
FIG. 14 illustrates a second process flow of editing and repairing an IC having a copper interconnect feature using the combined low-energy electron beam and ion beam apparatus of FIG. 11.

Alternatively, several distinct processes involving the combined electron beam and ion beam apparatus can be utilized for localized removal of copper features. FIGS. 13 and 14 illustrate just two of such process flows for editing and repairing ICs having copper features using both beams. In the process flow of FIG. 13, the copper feature is located (step 501), the surface mask is created and defined by the electron beam induced deposition (step 503), and then the copper feature is sputter-milled by the FIB with or without gas-assisted etching (step 508). An electron beam induced chemical etch is subsequently used to cleanup the thin re-deposited copper byproduct layer resulting from the previous ion beam mill step (step 505). Alternatively, the electron beam could be used to induce a reaction that transforms the re-deposited copper byproducts into non-conductive substances. As discussed in detail above, a halogen gas may then be introduced into the processing chamber (step 507a) to form the metal halide layer (511a) that is volatilized (step 513a) in order to edit the copper feature. Alternatively, an oxygen-based gas may be introduced into the processing chamber (step 507b) to form the metal oxide layer (511b) which is etched (step 513b) in order to edit the copper feature. Again, the etch rate, localization, and anisotropy are primarily determined by the ion beam process so that requirements on the electron beam process are relaxed, however, successful copper byproduct removal and electrical isolation are made possible by the complimentary electron beam processes. In the process flow of FIG. 14, gas-assisted FIB etching techniques, preferably using halogen gases such as $XeF_2$, may be used to form a re-deposited surface layer of $CuF_2$ from the original target feature which is desorbed at high-energy electron beam to volatilize the $CuF_2$ surface layer (step 609). Additionally, these processes may be assisted by irradiation with photons via laser or short wavelength UV lighting.

In accordance with the invention, it has been found that the electron beam surface masking techniques may be performed prior to the ion beam exposure and milling processes in order to minimize any copper sputtering re-deposition onto adjacent surfaces of the IC being repaired and/or edited. Further performing the electron beam surface masking depositions prior to the ion exposure techniques also significantly minimizes any damage to the organic-based ILD layers in need of repair and/or editing.

Accordingly, it has been found that the modified electron beam induced chemical apparatus and processes provide an easy and inexpensive solution for the complete and non-invasive removal of metal and/or organic based inter-level dielectric (ILD) features during editing, which includes repairing and prototyping processes, of ICs having such features. The invention advantageously provides for the complete volatilization of such features and thereby avoids the) undesired re-deposition of metal interconnect target feature materials, as well as avoiding any damage or contamination of the organic ILD materials associated with highly energetic ion beams, such as gallium ions (>30 keV) used in FIB processes. The substantially purely chemical etching induced by the electron beam can vastly improve etch selectivity between various materials and be spatially confined or localized to a smaller area through localized surface masking. This improves the spatial definition of such etch processes as well as simultaneously allows for high-resolution imaging and spectroscopy in-situ without erosion of the feature as a result of the electrons not causing significant mechanical erosion of the surface during imaging or analysis. The invention provides for halide desorption and evaporation, as well as the formation of metal oxides and subsequent etch reaction volatilization of such metal oxides for removal of metal interconnect features and/or organic ILD material.

While the present invention has been particularly described, in conjunction with a specific preferred embodiment, it is evident that many alternatives, modifications and variations will be apparent to those skilled in the art in light of the foregoing description. It is therefore contemplated that the Appended claims will embrace any such alternatives, modifications and variations as falling within the true scope and spirit of the present invention.

Thus, having described the invention, what is claimed is:

1. A method of editing an integrated circuit comprising the steps of:
   providing an integrated circuit;
   locating at least one feature in need of editing on the integrated circuit;
   contacting a surface of the feature in need of editing with low energy electrons having energies less than 5 keV to activate fly adsorbed gas molecules on the surface of the feature in need of editing to form byproducts by inelastic scattering between the low energy electrons and the adsorbed gas molecules; and
   removing the byproducts thereby editing the at least one feature.

2. The method of claim 1 wherein the at least one feature in need of editing is a feature in need of repair using said low energy electrons having energies less than 5 keV.

3. The method of claim 1 wherein the low energy electrons having energies less than 5 keV for activating the adsorbed gas molecules on the surface of the feature to be edited are emitted from a primary low-energy electron beam.

4. The method of claim 1 wherein the low energy electrons having energies less than 5 keV for activating the adsorbed gas molecules onto the surface of the feature to be edited comprise secondary low energy electrons that are emitted upon a primary electron beam contacting the surface of the feature, said secondary low energy electrons interact with the adsorbed gas molecules on the surface of the feature in need of editing to form said byproducts.

5. The method of claim 1 wherein the at least one feature in need of editing on the integrated circuit comprises a metallic interconnect feature.

6. The method of claim 5 further including the steps of:
forming a mask over the metallic interconnect feature in need of repair;
bombarding those portions of the metallic interconnect feature exposed through the mask with the low energy electrons;
providing an etch gas over the bombarded metallic interconnect feature whereby the low energy electrons activate adsorbed gas molecules on the surface of the feature in need of editing to form a metal byproduct layer; and
removing the metal byproduct layer thereby editing the integrated circuit.

7. The method of claim 6 wherein the steps include:
providing the etch gas comprising a halogen etch gas over the bombarded metallic interconnect feature whereby the dissociation of the halogen etch gas on the metallic interconnect feature by inelastic scattering with the low energy electrons forms the metal byproduct layer comprising a metal halide layer; and
removing the metal halide layer by volatilization thereby editing the metallic interconnect feature.

8. The method of claim 6 wherein the steps include:
providing the etch gas comprising an oxygen-based etch gas over the bombarded metallic interconnect feature whereby the dissociation of the oxygen-based etch gas on the metallic interconnect feature by inelastic scattering with the low energy electrons forms the metal byproduct layer comprising a metal oxide layer; and
removing the metal oxide layer thereby editing the metallic interconnect feature.

9. The method of claim 1 wherein the at least one feature in need of editing on the integrated circuit comprises an organic-based inter-level dielectric feature.

10. The method of claim 9 further including the steps of:
locating the organic-based inter-level dielectric feature;
providing a mask over the organic-based inter-level dielectric feature to expose a portion of the organic-based inter-level dielectric feature to be edited;
bombarding the portion of the organic-based inter-level dielectric feature exposed through the mask with the low energy electrons; and
providing an etch gas over the bombarded organic-based inter-level dielectric feature whereby the dissociation of the etch gas on the organic-based inter-level dielectric feature by inelastic scattering with the low energy electrons forms active species that chemically etch and remove the organic-based inter-level dielectric feature.

11. The method of claim 10 wherein the etch gas comprises a gas having high selectivity for the organic-based inter-level dielectric selected from the group consisting of $H_2O$, $O_2$, $N_2O_2$ and $XeF_2$.

12. The method of claim 1 further including the steps of:
locating both a metallic interconnect feature and an organic inter-level dielectric layer in need of editing on the integrated circuit; and
sequentially editing the metallic interconnect feature and the organic inter-level dielectric layer.

13. A method of editing an integrated circuit comprising:
providing a vacuum chamber having a gas nozzle therein;
providing an integrated circuit within the vacuum chamber,
locating at least one feature in need of editing on the integrated circuit;
injecting a gas into the vacuum chamber through the gas nozzle to provide adsorption of gas molecules on a surface of the at least one feature in need of editing prior to interaction with low energy electrons within the vacuum chamber;
bombarding the surface of the at least one feature with the low energy electrons having energies less than 5 keV to inelastic scatter with the adsorbed gas molecules on the surface of the at least one feature to form volatile byproducts; and
removing the volatile byproducts thereby editing the at least one feature of the integrated circuit.

14. The method of claim 13 wherein the gas is selected from the group consisting of a halogen gas and an oxygen-based gas.

15. The method of claim 13 wherein the gas dissociates by inelastic scattering with the low energy electrons to form reaction products on a surface of the at least one feature that are removed by etching.

16. The method of claim 13 wherein the low energy electrons of energies less than 5 keV for activating the adsorbed gas molecules on the surface of the feature are emitted from a primary low-energy electron beam.

17. The method of claim 13 wherein the low energy electrons of energies less than 5 keV for activating the adsorbed gas molecules on the surface of the feature comprise secondary low energy electrons that are emitted upon a primary electron beam contacting the surface of the feature, said secondary low energy electrons interact with the adsorbed reactants on the surface of the feature in need of editing to form said byproducts.

18. The method of claim 13 further including the step of maintaining a constant vacuum pressure in the vacuum chamber of less than $10^{-5}$ Torr to prevent damage to an electron beam source and optics.

19. An apparatus for editing an integrated circuit comprising:
a vacuum chamber;
a gas nozzle within the vacuum chamber for injecting a gas into the vacuum chamber to provide adsorption of gas molecules on a feature surface in need of editing therein the vacuum chamber prior to interaction with low energy electrons electrons beam; and
low energy electron column within the vacuum chamber for emitting an electron beam of low-energy electrons having energies less than 5 keV within said vacuum chamber to inelastic scatter with the adsorbed gas molecules on the feature surface to form volatile byproducts on the feature surface that are easily removed while forming substantially minimal feature surface contamination and damage.

20. The apparatus of claim 19 further including an ion beam column within the vacuum chamber for providing significantly higher rates of removal and anisotropy of the feature surface in need of editing.

* * * * *